(12) United States Patent
Koyama et al.

(10) Patent No.: US 7,138,764 B2
(45) Date of Patent: Nov. 21, 2006

(54) LIGHT-EMITTING DEVICE AND ELECTRONIC INSTRUMENT

(75) Inventors: Tomoko Koyama, Hara-mura (JP); Takeo Kaneko, Misato-mura (JP); Taketomi Kamikawa, Shiojiri (JP); Norio Oguchi, Chino (JP); Atsushi Harada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 370 days.

(21) Appl. No.: 10/268,988

(22) Filed: Oct. 11, 2002

(65) Prior Publication Data

US 2003/0094897 A1     May 22, 2003

(30) Foreign Application Priority Data

Oct. 24, 2001   (JP) ............................. 2001-326002

(51) Int. Cl.
*H05B 33/00*   (2006.01)

(52) U.S. Cl. ..................... 313/506; 313/113; 313/498; 313/509

(58) Field of Classification Search ................ 313/498, 313/506, 512, 502, 509, 113
See application file for complete search history.

(56) References Cited

U.S. PATENT DOCUMENTS

| 4,843,280 | A | * | 6/1989 | Lumbard et al. | ............ | 313/512 |
|---|---|---|---|---|---|---|
| 5,142,192 | A | * | 8/1992 | Takahashi et al. | .......... | 313/506 |
| 5,834,893 | A | * | 11/1998 | Bulovic et al. | ............. | 313/506 |
| 6,114,088 | A | * | 9/2000 | Wolk et al. | .............. | 430/273.1 |
| 6,121,726 | A | * | 9/2000 | Codama et al. | ............. | 313/506 |
| 6,833,667 | B1 | * | 12/2004 | Hamano et al. | ............ | 313/504 |
| 6,858,983 | B1 | * | 2/2005 | Mochizuki et al. | ......... | 313/512 |

FOREIGN PATENT DOCUMENTS

| JP | A 63-70257 | 3/1988 |
|---|---|---|
| JP | A 63-175860 | 7/1988 |
| JP | A 2-135359 | 5/1990 |
| JP | A 2-135361 | 5/1990 |
| JP | A 3-152184 | 6/1991 |
| JP | A 8-248276 | 9/1996 |
| JP | A 9-190883 | 7/1997 |
| JP | A 10-153967 | 6/1998 |
| JP | A 2001-332388 | 11/2001 |
| JP | A 2002-25781 | 1/2002 |

OTHER PUBLICATIONS

U.S. Appl. No. 09/803,034, filed Mar. 12, 2001, Yudusaka.

* cited by examiner

*Primary Examiner*—Ashok Patel
(74) *Attorney, Agent, or Firm*—Oliff & Berridge, PLC (57) ABSTRACT

A light-emitting device includes a light-emitting layer capable of generating light by electroluminescence, a pair of electrodes applies an electric field to the light-emitting layer, and a substrate having a depression in a surface, and the light-emitting layer is disposed within the depression of the substrate.

7 Claims, 9 Drawing Sheets

LIGHT-EMITTING DEVICE AND ELECTRONIC INSTRUMENT

Japanese Patent Application No. 2001-326002, filed Oct. 24, 2001, is hereby incorporated by reference in its entirety.

BACKGROUND OF THE INVENTION

The present invention relates to a light-emitting device using electroluminescence (EL) and to an electronic instrument.

For example, a surface emission type EL light-emitting element using electroluminescence (EL) emits light isotropically, and the element is formed on a flat substrate. Therefore, a surface emission type EL light-emitting element is susceptible to losses from light emitted from the lateral surface of the light-emitting layer. When a surface emission type EL light-emitting element is considered in respect of a particular direction, the light intensity is weak, and it is difficult to exploit the emitted light efficiently.

BRIEF SUMMARY OF THE INVENTION

The present invention may provide a light-emitting device with a new construction, in which for example, light can be exploited efficiently, and which can be applied not only in a display, but also in optical communications. Furthermore, the present invention may also provide an electronic instrument using the same.

A light-emitting device according to one aspect of the present invention comprises a light-emitting layer capable of generating light by electroluminescence, a pair of electrodes which applies an electric field to the light-emitting layer, and a substrate having a depression in a surface, and the light-emitting layer is disposed within the depression of the substrate.

DETAILED DESCRIPTION OF THE EMBODIMENT

A light-emitting device according to one embodiment of the present invention comprises:

a light-emitting layer capable of generating light by electroluminescence;

a pair of electrodes which applies an electric field to the light-emitting layer; and a substrate having a depression in a surface, wherein the light-emitting layer is disposed within the depression of the substrate.

Since the light-emitting device has a novel construction in which the light-emitting layer is disposed within the depression on the surface of the substrate, when applied to a surface emission type light-emitting device, a flat light-emitting device which is space-saving in the height direction can be realized.

It should be noted that the term "substrate" is not restricted to, for example, a single-layer substrate such as a plastic substrate, glass substrate, or silicon substrate, but indicates a substrate including a portion forming a support on which is formed a light-emitting element including the electrodes and light-emitting layer. Therefore, the expression "substrate having a depression in a surface" is not restricted to a case in which the surface of the substrate is in advance formed into a depression, but also includes a case in which an additional layer having a depression is formed over a flat substrate.

This embodiment of the light-emitting device may adopt the following forms.

(1) At least part of one of the electrodes may be disposed over the depression, and may be capable of reflecting light generated in the light-emitting layer. For example, for an electrode having a given degree of reflectivity, at least a part thereof can be formed to have a depression, and the light-emitting layer can be disposed within the depression.

The substrate may be capable of reflecting light generated in the light-emitting layer. For example, at least a part of a substrate whose surface is reflective with respect to the light generated in the light-emitting layer can be formed into a depression, and the light-emitting layer can be disposed within the depression.

This light-emitting device may include a dielectric multilayer film which is capable of reflecting light generated in the light-emitting layer, and the dielectric multilayer film maybe disposed over the depression of the substrate. For example, using the reflecting function of a dielectric multilayer film having alternately laminated materials of different refractive indices, the light-emitting layer can be disposed over this multilayer film.

According to this construction, light generated isotropically within the light-emitting layer is reflected by the electrode provided over the depression or by the depression of the substrate capable of reflecting light, in a given direction (for example, in one direction with respect to the surface of the substrate), and is emitted externally, as a result of which the emitted light can be exploited efficiently. According to this construction, since the emitted light in a particular direction is augmented by the reflected light, the directionability of the emitted light is improved, and for example, an optical communications device of good optical coupling efficiency to an optical fiber can be realized. According to this construction, since the light-emitting layer is disposed within the depression of the substrate, light emitted other than in the desired direction can be emitted in a desired direction (for example, in one direction with respect to the surface of the substrate), and the emitted light can be exploited efficiently.

(2) When the substrate capable of reflecting light is used, the light-emitting device may include a gate electrode disposed between the electrodes which forms a conducting region within the light-emitting layer.

According to this construction, by controlling a voltage applied to the gate electrode, the generation of light in the light-emitting layer can be selectively controlled. The gate electrode is not particularly restricted as long as it includes a conducting layer capable of forming a conducting region within the light-emitting layer.

(3) The light-emitting layer may function as an optical lens.

According to this construction, since the light-emitting layer itself functions as an optical lens, emitted light can be obtained with high efficiency and with high directionability.

Furthermore, over the light-emitting layer, a lens layer to function as an optical lens maybe formed. In this construction also, in the same way as when the light-emitting layer functions as an optical lens, emitted light can be obtained with high efficiency and with high directionability.

(4) A light-emitting device according to another embodiment of the present invention includes a light-emitting layer capable of generating light by electroluminescence;

a pair of electrodes which applies an electric field to the light-emitting layer; and a substrate, wherein the light-emitting layer is disposed between the electrodes, and wherein at least one of the electrodes is formed to have a convex surface with respect to the substrate.

One of the electrodes may be capable of reflecting light generated in the light-emitting layer.

According to this construction, when the light generated within the light-emitting layer is emitted in the direction to pass through the substrate, emitted light can be obtained of high directionability and high efficiency. According to this construction, when the light is emitted in the direction not passing through the substrate, since the light is scattered according to the shape of the convex surface, a display device of high visibility can be realized.

Here the convex surface can take the following forms.

For example, the convex surface may be formed by a part of one of the electrodes into a convex shape.

For example, the convex surface may be formed by disposing one of the electrodes over a convex member formed on the substrate.

For example, the convex surface may be formed by disposing one of the electrodes over the light-emitting layer formed with a convex shape.

It should be noted that in this embodiment of the light-emitting device, as a charge transport layer, a hole transport layer or electron transport layer can be provided, if necessary. By providing this charge transport layer, the efficiency of light generation by electroluminescence within the light-emitting layer can be improved.

It should be noted that the cross-sectional form of the depression or convexity can be, for example, V-shaped (triangular), semicircular, semi-elliptical, or hyperbolic, and the interior bottom portion (the top portion) can be flat, and the walls of inclined or curved form. The cross-sectional form of the depression or convexity is not limited to the above described, and other desirable concave (convex) cross-sectional forms are also possible.

(5) This embodiment of the electronic instrument includes the above light-emitting device. For example, a various types of display devices in which the above light-emitting device is used for a display, or an optical communications device in which the above light-emitting device is used as a light source, are among those that may be cited.

Next, some of the materials which can be used in various parts of this embodiment of the light-emitting device are given as examples. These materials are no more than recitations of only some well-known materials, and in addition to the materials given as examples it will naturally be the case that other selections are possible.

Light-emitting Layer

The material of the light-emitting layer may be selected from well-known chemical compounds for obtaining a particular wavelength of light. As the material of the light-emitting layer may be used either an organic compound or an inorganic compound, but from the viewpoint of the range of availability and the ease of forming a film, an organic compound is preferable.

As such an organic compound can be used, for example, as described in Japanese Patent Application Laid-Open No. 10-153967, aromatic diamine derivatives (TPD), oxadiazole derivatives (PBD), oxadiazole dimer (OXD-8), distyrylarylene derivatives (DSA), beryllium-benzoquinolinol complex (BeBq), triphenylamine derivatives (MTDATA), rubrene, quinacridone, triazole derivatives, polyphenylene, polyalkylfluorene, polyalkylthiophene, azomethine zinc complex, porphyrin zinc complex, benzoxazole zinc complex, phenanthroline-europium complex, and so on.

As more specific organic materials of the light-emitting layer can be used well-known materials such as those disclosed in Japanese Patent Application Laid-Open No. 63-70257, Japanese Patent Application Laid-Open No. 63-175860, Japanese Patent Application Laid-Open No. 2-135361, Japanese Patent Application Laid-Open No. 2-135359, Japanese Patent Application Laid-Open No. 3-152184, Japanese Patent Application Laid-Open No. 8-248276, and Japanese Patent Application Laid-Open No. 10-153967. These compounds may be used singly or in combinations of two or more varieties.

As examples of inorganic compounds may be cited ZnS:Mn (red region), ZnS:TbOF (green region), SrS:Cu, SrS:Ce (blue region), and so on.

Electrodes

The cathode, that is to say, the electrode for injecting electrons into the light-emitting layer is an electron injecting electrode with a low work function (for example, not more than 4 eV), and an alloy electrically conducting compound or mixture thereof can be used. As the material of such an electrode can be used for example that disclosed in Japanese Patent Application Laid-Open No. 8-248276.

As the anode, that is to say, the electrode for injecting holes into the light-emitting layer, a metal, alloy, or electrically conducting compound, or a mixture thereof with a high work function (for example, at least 4 eV) can be used. When an optically transparent material is used as the anode, CuI, ITO, $SnO_2$, ZnO, or a similar conducting transparent material can be used. When transparency is not required of the anode, a metal such as gold can be used.

Dielectric Multilayer Film

The dielectric multilayer film is constructed by laminating alternate layers of materials with different refractive indices. As such a laminated construction can be cited a layer construction of alternating layers being, for example, silicon oxide layers ($SiO_2$) and silicon nitride layers ($SiN_x$). Alternatively, for example, a dielectric multilayer film can be formed from two alternating layers selected from $TiO_2$, $Ta_2O_5$, $MgF_2$, and ZnS.

Lens Layer

The material of the lens layer functioning as an optical lens can be selected from, for example, plastics synthetic resin, glass, or similar well-known optical lens materials. Further, for the material of the lens layer, thermoplastic resins such as polymethylmethacrylate (PMMA), styrene acrylonitrile (SAN), polystyrene (PS), polycarbonate (PC) or the like, or copolymer materials such as the above mentioned PMMA or methylmethacrylate (MMA) materials are preferable from the viewpoint of ease of formation.

Hole Transport Layer

The material of the hole transport layer provided as required can be selected from those well-known and used as an optically conducting material hole injection material, or well-known substances used for a hole injection layer of an organic light-emitting device. The material of the hole transport layer is such as to have the function either of injecting holes or blocking electrons, and may be either an organic material or an inorganic material. As specific examples may be cited for example those disclosed in Japanese Patent Application Laid-Open No. 8-248276.

Electron Transport Layer

Provided that it has the function of transporting electrons injected by the cathode to the organic light-emitting layer, the material of the electron transport layer provided as required can be selected from well-known substances. As specific examples may be cited for example those disclosed in Japanese Patent Application Laid-Open No. 8-248276.

Layers and the like of the light-emitting device can be formed by well-known methods. For example, for the layers of the light-emitting device, a preferred film formation method suited to the particular material is selected, and specifically the film can be formed using the vapor deposition method, spin coating, the LB method, an inkjet method, and so on.

Herebelow, taking a surface emission type light-emitting device preferred as an example of embodying the present invention, embodiments are described. In each embodiment, one direction with respect to the surface of the substrate is referred to as the "front surface direction," and the other direction with respect to the surface of the substrate is referred to as the "rear surface direction."

First Embodiment

Figure 1:
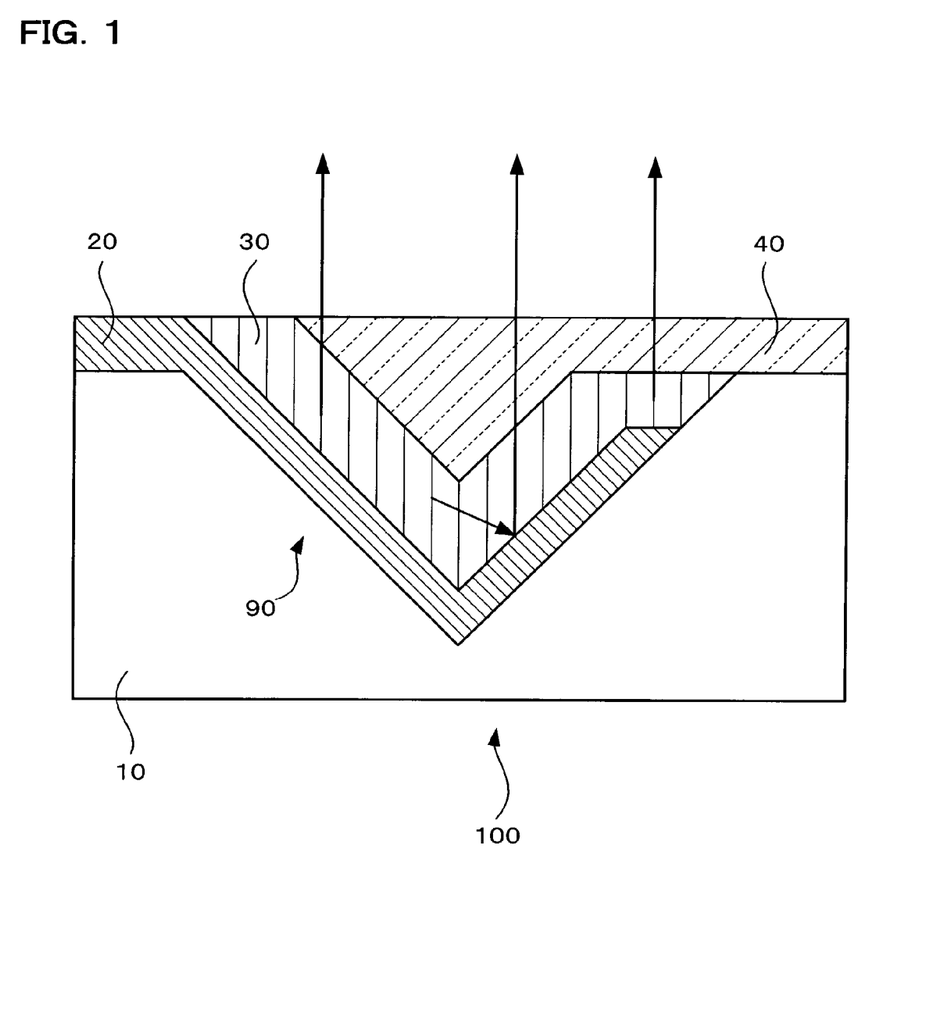
FIG. 1 is a schematic sectional view of a first embodiment of the light-emitting device of the present invention.

FIG. 1 is a cross-sectional view showing schematically an example of a surface emission type light-emitting device 100, being a first embodiment of the present invention.

The light-emitting device 100 has a depression 90 of V-shaped cross-section formed in the surface of a substrate 10. Over this depression 90, a cathode 20, light-emitting layer 30, and anode 40 are laminated in sequence.

In this embodiment of the light-emitting device 100, when an electric field is applied between the cathode 20 and anode 40, electrons and holes injected into the light-emitting layer 30 combine, forming excitons. Then when these excitons become deactivated, light is emitted. Light is emitted in the embodiments described below by the same mechanism.

The cathode 20 is formed of a material such as, for example, aluminum alloy, gold, silver, titanium, chromium, or the like that has the property of reflecting light. The surface of the cathode 20 functions as a light reflecting surface. Thus, light generated within the light-emitting layer 30 in, for example, the direction of the rear surface is reflected by the surface of the cathode 20, and emitted in the direction of the front surface.

The anode 40 is laminated over the light-emitting layer 30, and is formed as a transparent electrode having the property of transmitting light of for example ITO or the like. As a result, light emitted from the light-emitting layer 30 passes through the anode 40, to be emitted to the exterior.

The light-emitting layer 30 is formed within the depression 90 provided in the substrate 10. As a result, for example, light emitted in the rear surface direction is reflected by the cathode 20, and emitted in the front surface direction.

According to this embodiment of the light-emitting device 100, of the light generated isotropically within the light-emitting layer 30, not only the light emitted in the front surface direction, but also the light emitted in the rear surface direction is reflected by the cathode 20 to be emitted in the front surface direction. As a result, in the light-emitting device 100, emitted light can be obtained in the front surface direction with high efficiency and excellent directionability.

According to this embodiment, since the light-emitting layer 30 and the like is disposed within the depression 90, there is no projection in the direction of the thickness of the film, and a novel light-emitting device having a flat construction can be realized.

Since the light-emitting device 100 does not require a special-purpose device to reflect light generated in the light-emitting layer 30, it can be realized easily.

Second Embodiment

Figure 2:
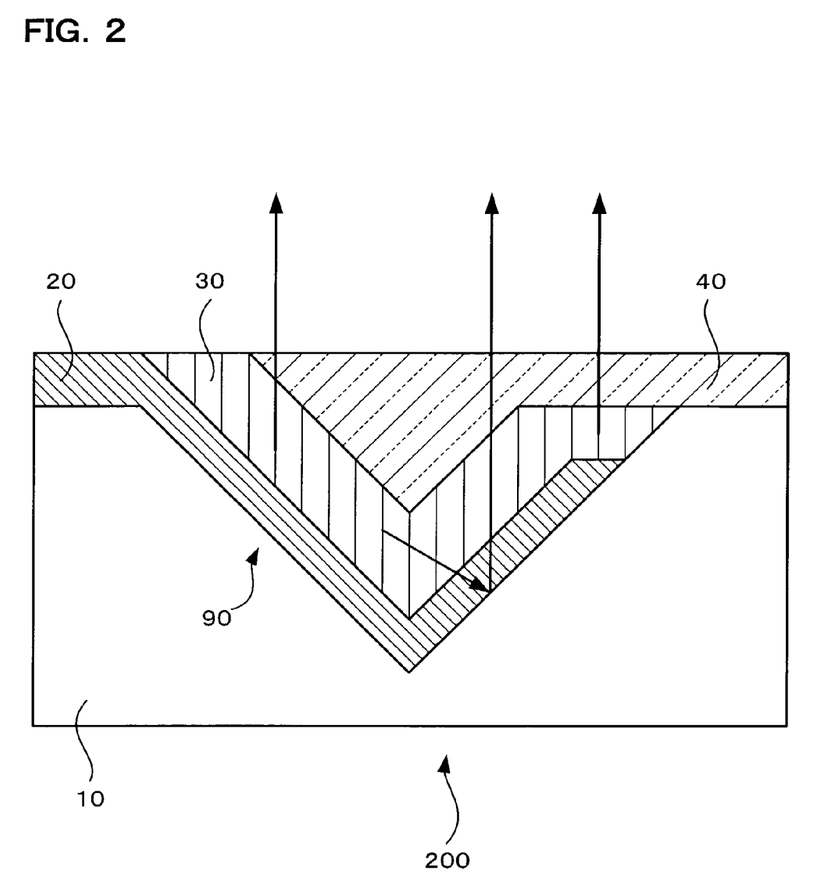
FIG. 2 is a schematic sectional view of a second embodiment of the light-emitting device of the present invention.

FIG. 2 is a cross-sectional view showing schematically an example of a surface emission type light-emitting device 200 being a second embodiment of the present invention. Elements having substantially the same function as elements shown in FIG. 1 are indicated with the same reference numerals, and principally the principal points of difference are described.

The light-emitting device 200 has the same layer construction as the light-emitting device 100 of the first embodiment, but in place of the cathode 20, the substrate 10 has the function of reflecting light. In the light-emitting device 200, light emitted in the rear surface direction within the light-emitting layer 30 is reflected in the front surface direction at the surface of the depression 90 of the substrate 10, to be emitted to the exterior.

As a result, according to this embodiment of the light-emitting device 200, the same effect and benefit as in the first embodiment of the light-emitting device 100 can be obtained. According to this embodiment, since the electrode (20 or 40) does not necessarily have to be optically reflecting as in the light-emitting device 100 of the first embodiment, and therefore the range of selection of the material of the electrode (20 or 40) is increased.

In the case in which as in this embodiment the light generated in the light-emitting layer 30 is reflected by the substrate 10, as the substrate 10 can be used a semiconductor substrate (for example, a silicon substrate). In this case, the substrate 10 can be electrically insulated from the cathode 20 and anode 40 by the provision of an insulating layer or the like on the substrate 10. Furthermore, for this insulating layer can be used, for example, an oxide film of silicon oxide or the like formed by oxidizing the surface of the silicon substrate. Then in the case that the substrate 10 is a semiconductor substrate, the drive circuit for the light-emitting device can be integrated into the same substrate.

Third Embodiment

Figure 3:
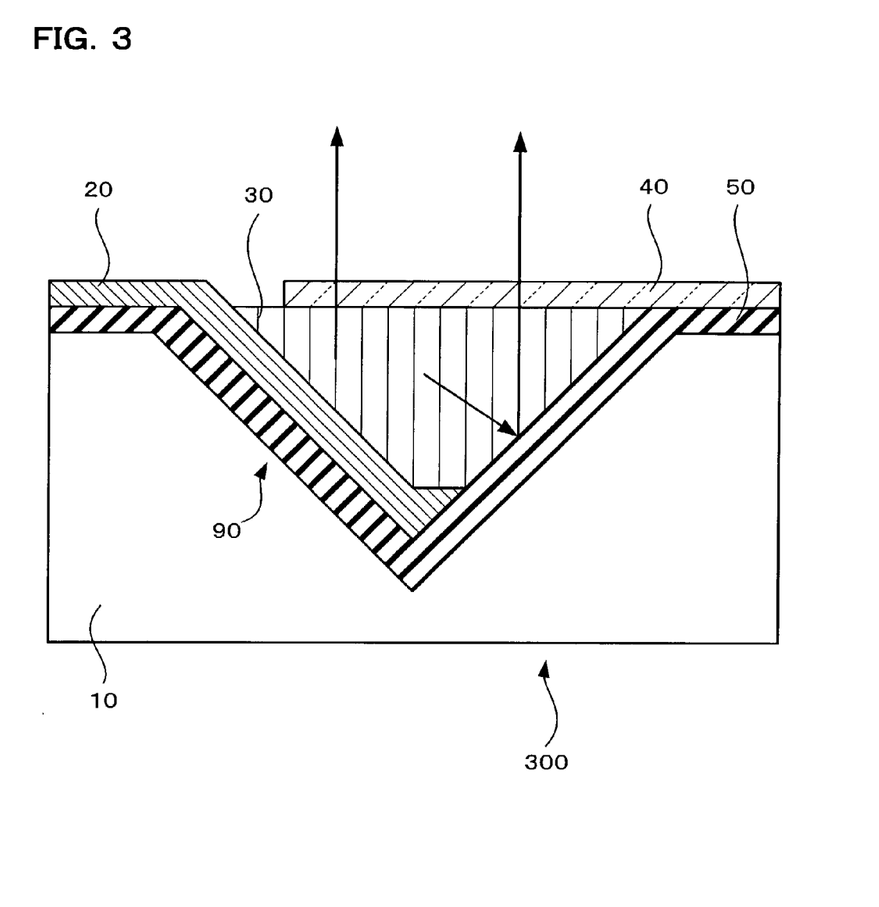
FIG. 3 is a schematic sectional view of a third embodiment of the light-emitting device of the present invention.

FIG. 3 is a cross-sectional view showing schematically an example of a surface emission type light-emitting device 300, being a third embodiment of the present invention.

Elements having substantially the same function as elements shown in FIG. 1 are indicated with the same reference numerals, and principally the principal points of difference are described.

The light-emitting device 300 has a dielectric multi-layer film 50 laminated from multiple dielectric layers of different refractive indices disposed in the depression 90 of the substrate 10. The light-emitting device 300 has a construction with the cathode 20, light-emitting layer 30, and anode 40 further laminated thereon. Therefore, since in the light-emitting device 300 of this embodiment light can be reflected by the dielectric multilayer film 50, light generated in the light-emitting layer 30 in the rear surface direction can be reflected in the front surface direction and can be emitted to the exterior.

Therefore, according to this embodiment of the light-emitting device 300, the same effect and benefit as in the above described embodiments can be obtained. Furthermore, according to this embodiment, the range of selection of the material of the substrate (10) and the material of the electrodes (20, 40) is increased.

Fourth Embodiment

Figure 4:
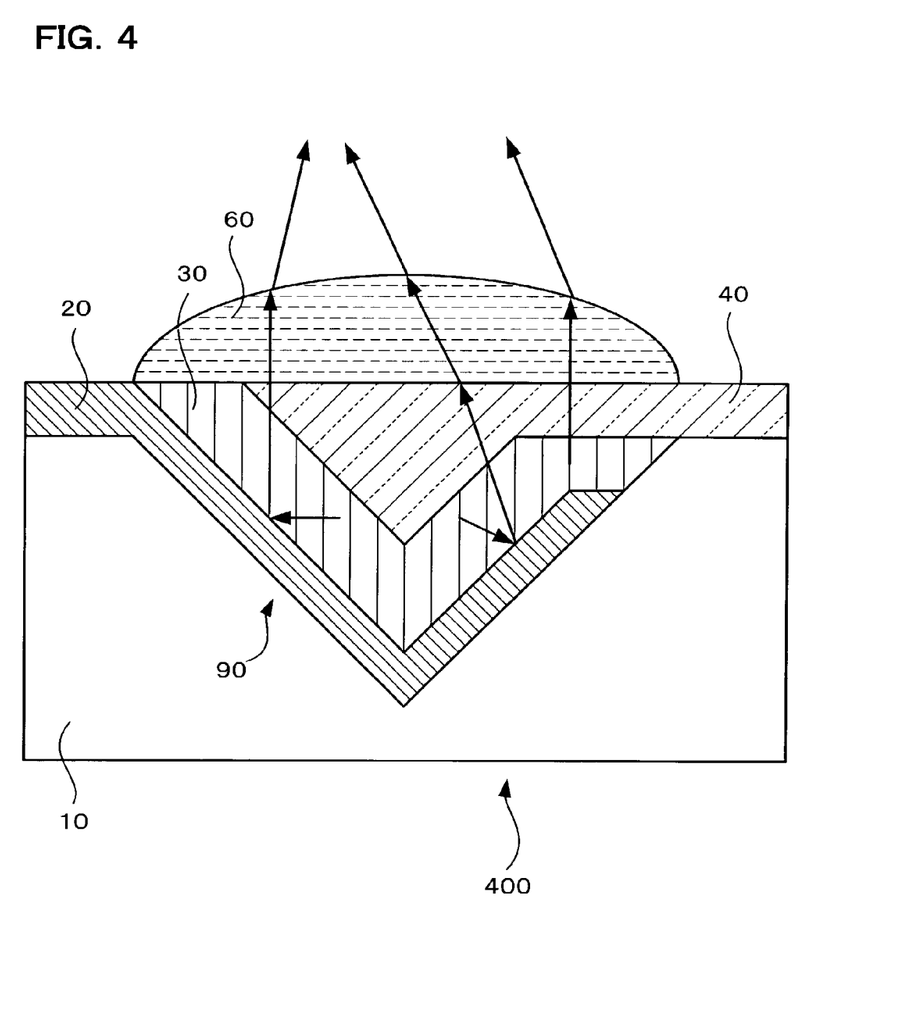
FIG. 4 is a schematic sectional view of a fourth embodiment of the light-emitting device of the present invention.

FIG. 4 is a cross-sectional view showing schematically an example of a surface emission type light-emitting device 400 being a fourth embodiment of the present invention. Elements having substantially the same function as elements shown in FIG. 1 are indicated with the same reference numerals, and principally the principal points of difference are described.

The light-emitting device 400 has the same construction as the light-emitting device 100 of the first embodiment, but has further a lens layer 60 formed thereon. This lens layer 60 functions as an optically convex lens, and can be formed, for example, of a synthetic resin capable of transmitting the light generated in the light-emitting layer 30.

That is to say, with the light-emitting device 400, the same effect and benefit as in the first embodiment of the light-emitting device 100 can be obtained. Furthermore, according to the light-emitting device 400, light emitted in the front surface direction passes through the lens layer 60 to be emitted to the exterior, and thus emitted light of some strength in a particular direction and of greatly improved directionability light can be obtained. If the light-emitting device 400 is applied to optical communications, for example, an optical communications device of good optical coupling efficiency to an optical fiber can be realized.

It should be noted that in this embodiment, the example shown is of the lens layer 60 formed so as to function as a convex lens, but the invention is not limited to this. The lens layer 60 can be formed to function as, for example, a concave lens, or as another form of optical lens.

Fifth Embodiment

Figure 5:
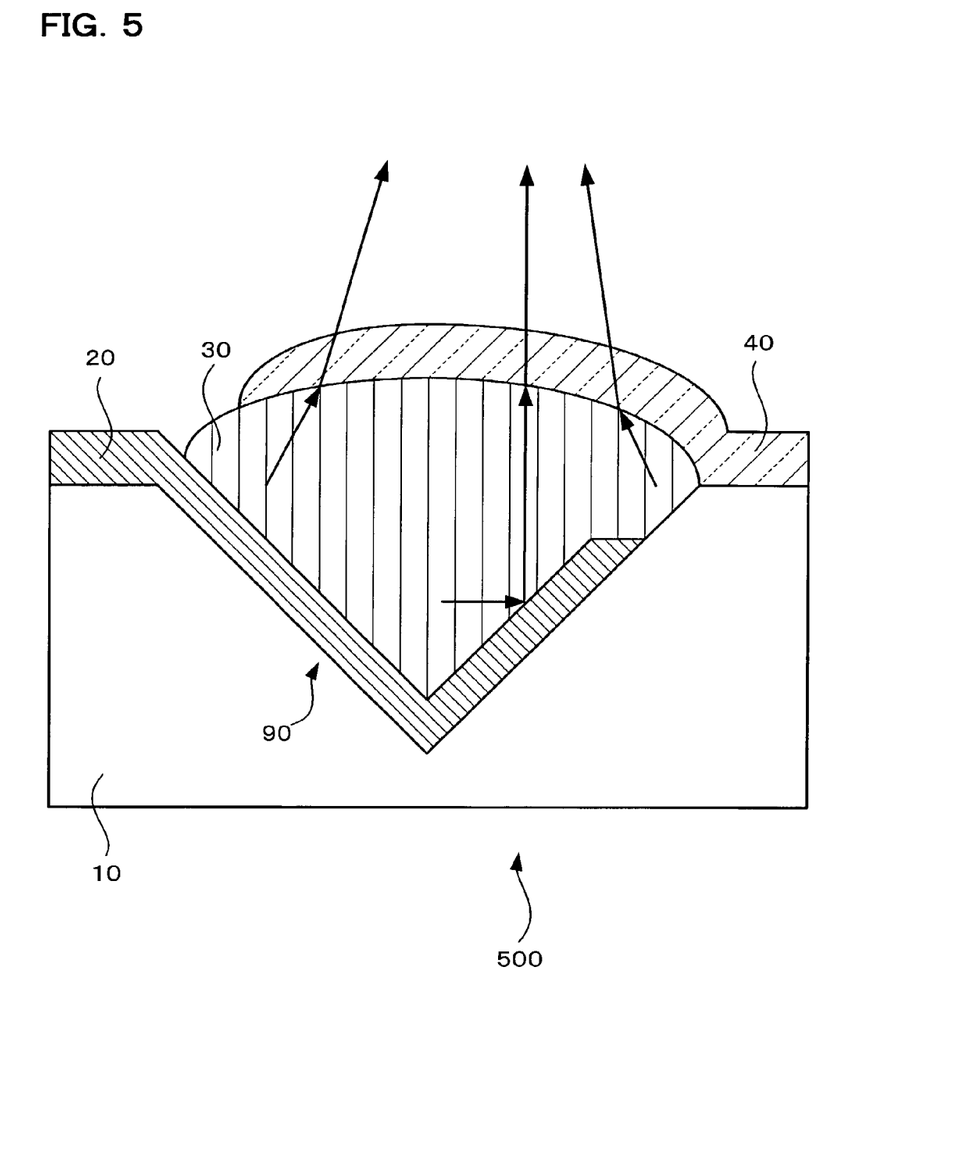
FIG. 5 is a schematic sectional view of a fifth embodiment of the light-emitting device of the present invention.

FIG. 5 is a cross-sectional view showing schematically an example of a surface emission type light-emitting device 500 being a fifth embodiment of the present invention. Elements having substantially the same function as elements shown in FIG. 1 are indicated with the same reference numerals, and principally the principal points of difference are described.

The light-emitting device 500, as in the first embodiment, uses the cathode 20 as a light reflecting surface. The light-emitting device 500 has a construction with the light-emitting layer 30 and anode 40 laminated in sequence on the cathode 20. Then the light-emitting layer 30 is formed to function as a convex lens being an optical lens.

Thus, in this embodiment of the light-emitting device 500, light emitted in the rear surface direction is reflected by the cathode 20, and the reflected light is emitted in a particular direction, for example in the front surface direction, by virtue of the function of the optical lens formed by the light-emitting layer 30.

As a result, according to this embodiment of the light-emitting device 500, the same effect and benefit as of the fourth embodiment of the light-emitting device 400 can be obtained. Furthermore, according to the light-emitting device 500, it is not necessary to provide a new element to increase the directionability of the emitted light. When the light-emitting device 500 is applied to optical communications, an optical communications device of, for example, good optical coupling efficiency to an optical fiber can be realized.

It should be noted that even in the case that as in this embodiment the light-emitting layer 30 is formed to function as an optical lens, as in the fourth embodiment of the light-emitting device 400, a lens layer may be provided on the top.

In this embodiment, the example shown is of the light-emitting layer 30 formed so as to function as a convex lens, but the invention is not limited to this. The light-emitting layer 30 can be formed to function as, for example, a concave lens, or as another form of optical lens.

Sixth Embodiment

Figure 6:
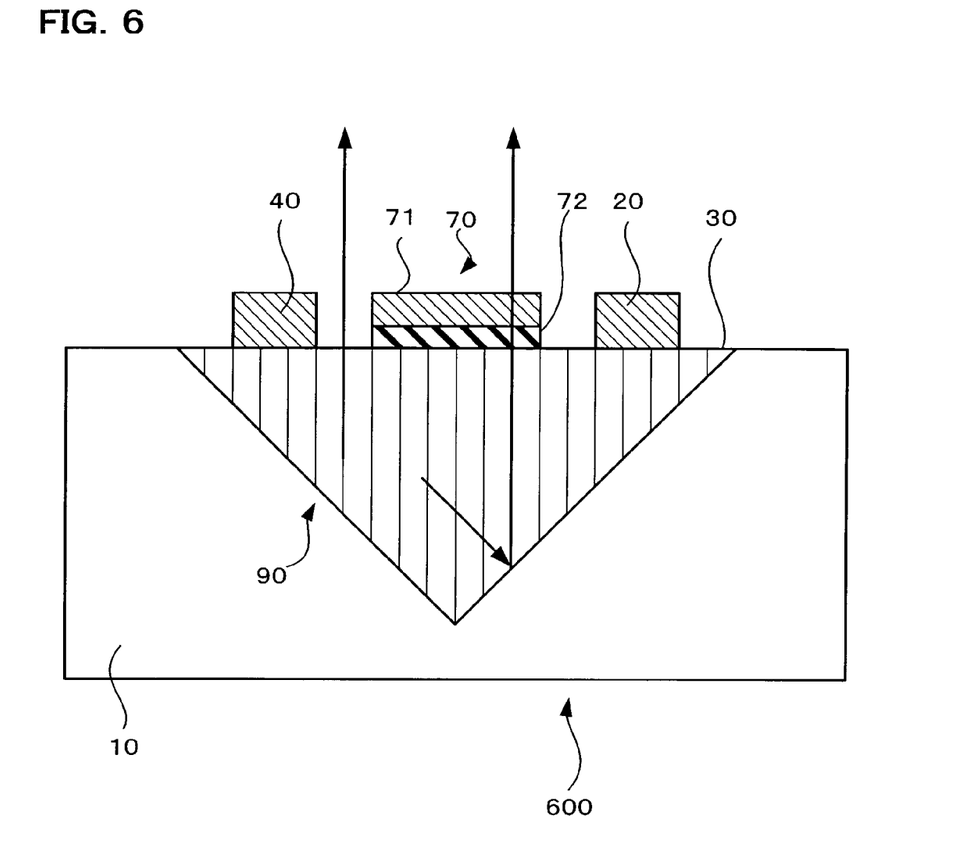
FIG. 6 is a schematic sectional view of a sixth embodiment of the light-emitting device of the present invention.

FIG. 6 is a cross-sectional view showing schematically an example of a surface emission type light-emitting device 600 being a sixth embodiment of the present invention. Elements having substantially the same function as elements shown in FIG. 1 are indicated with the same reference numerals, and principally the principal points of difference are described.

The light-emitting device 600 has the construction of the cathode 20, anode 40, and gate electrode 70 provided on the light-emitting layer 30. The gate electrode 70 can be provided between the cathode 20 and the anode 40. The gate electrode 70 comprises a conducting layer 71 and an interlayer insulating layer 72, and by means of an applied voltage, functions to form a conducting region within the light-emitting layer 30.

With this light-emitting device 600, by applying a voltage to the gate electrode 70, a conducting region is formed within the light-emitting layer 30. Then by controlling this applied voltage the current flowing within the light-emitting layer 30 is controlled, and the light emission of the light-emitting layer 30 can be selectively controlled.

In the light-emitting device 600, in the same way as in the second embodiment of the light-emitting device 200, the substrate 10 has a light-reflecting function. As a result, light emitted in the rear surface direction in the light-emitting layer 30 is reflected by the surface of the substrate depression 90 and is emitted in the front surface direction.

In this way, according to this embodiment of the light-emitting device 600, the same effect and benefit as in the second embodiment of the light-emitting device 200 is obtained. Furthermore, according to the light-emitting device 600, the light emission of the light-emitting layer 30 can be selectively controlled.

It should be noted that in this embodiment of the light-emitting device 600, in place of the substrate 10 having a light-reflecting function, as in the third embodiment of the light-emitting device 300 a dielectric multilayer film or other light-reflecting element can be provided.

A lens layer maybe provided over the light-emitting layer 30, as in the fourth embodiment of the light-emitting device 400, or the light-emitting layer 30 may be formed to have a lens function, as in the fifth embodiment of the light-emitting device 500. According to such a construction, by application to optical communications, for example, an optical communications device of good optical coupling efficiency to an optical fiber can be realized.

Seventh Embodiment

Figure 7:
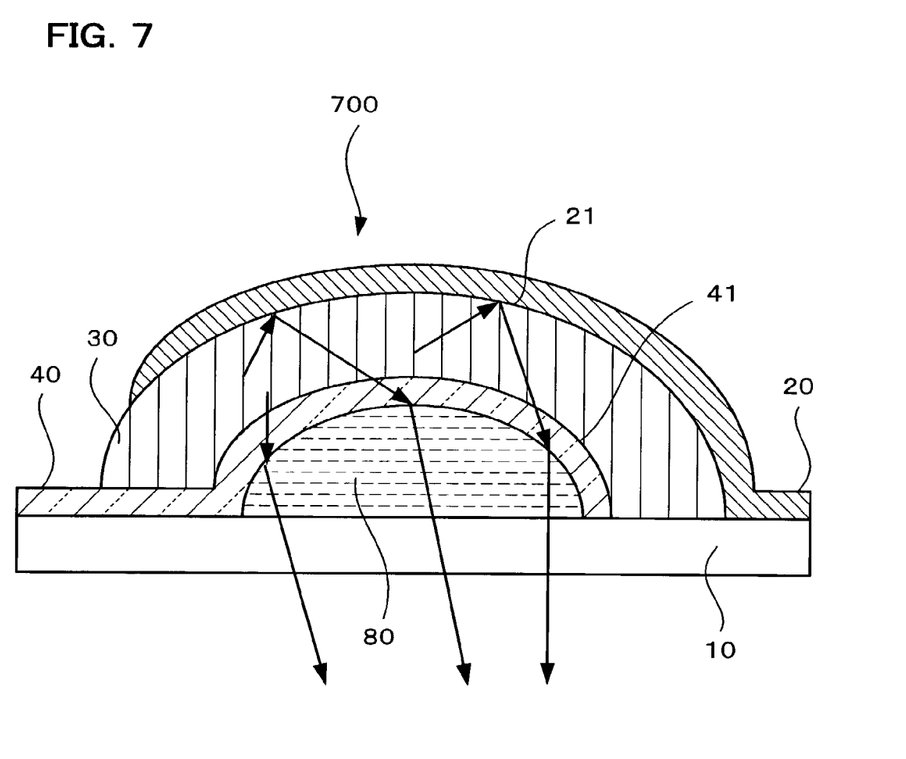
FIG. 7 is a schematic sectional view of a seventh embodiment of the light-emitting device of the present invention.

FIG. 7 is a cross-sectional view showing schematically an example of a surface emission type light-emitting device 700 being a seventh embodiment of the present invention. Elements having substantially the same function as elements shown in FIG. 1 are indicated with the same reference numerals, and principally the principal points of difference are described.

The light-emitting device 700 has a convex member 80 having a semi-elliptical cross-section provided on the substrate 10. The light-emitting device 700 has the anode 40 laminated thereon, whereby the anode 40 is formed to have a convex surface 41 having a semi-elliptical shape with respect to the substrate. The light-emitting device 700 has the light-emitting layer 30 and the cathode 20 having a light-reflecting function laminated with uniform thickness in sequence over the anode 40. As a result, the cathode 20 has a convex surface 21 with respect to the substrate 10. Furthermore, the light-emitting device 700 is constructed so that the substrate 10 and convex member 80 are transparent with respect to the light generated in the light-emitting layer 30, and to allow the light to be emitted in the rear surface direction.

As a result, according to the light-emitting device 700, of the light generated in the light-emitting layer 30, for example, the light generated in the front surface direction is reflected by the convex surface 21 of the cathode 20 and emitted in the rear surface direction, as a result of which the light can be exploited efficiently.

It should be noted that in this embodiment of the light-emitting device 700, when the convex member 80 is formed so as to have a lens function, the directionability of the light which has passed through the convex member 80 is excellent, and the strength in a particular direction is high. According to such a construction, by application to optical communications, for example, an optical communications device of good optical coupling efficiency to an optical fiber can be realized.

In this embodiment, the convex member 80 is provided in such a way that of the pair of electrodes (20, 40), at least one electrode has a convex surface (21 or 41) with respect to the substrate, but the invention is not limited to this. For example, by forming the light-emitting layer 30 to be convex, the electrodes may be constructed so as to have a convex surface (21 or 41) with respect to the substrate.

Eighth Embodiment

Figure 8:
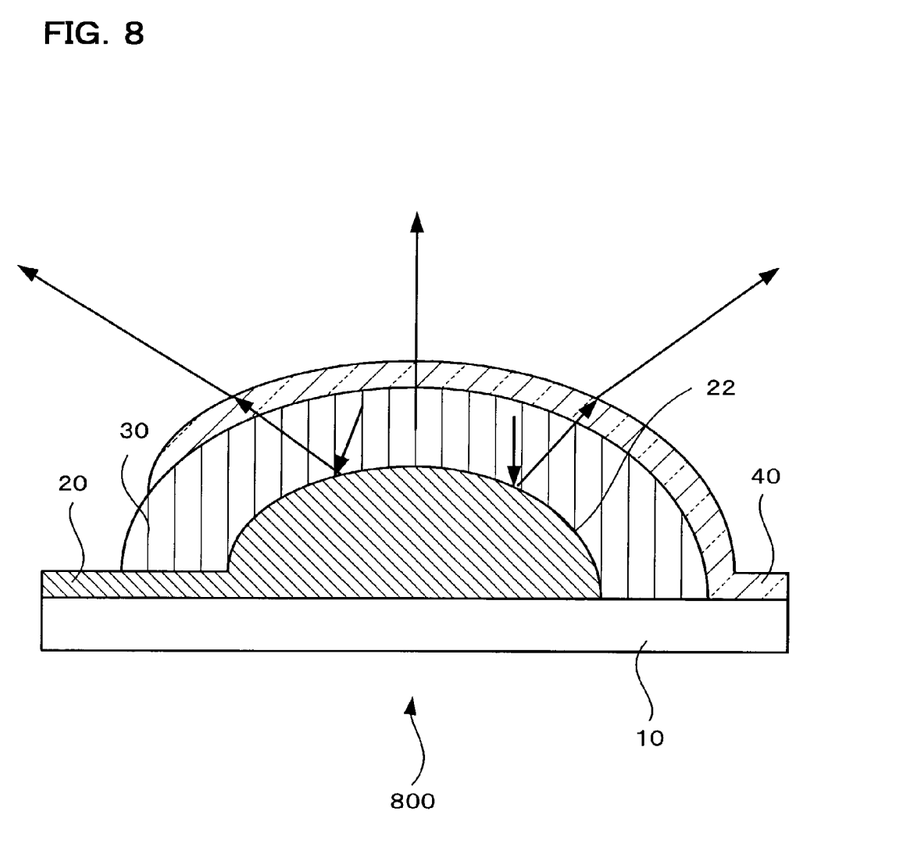
FIG. 8 is a schematic sectional view of an eighth embodiment of the light-emitting device of the present invention.
Figure 9A:
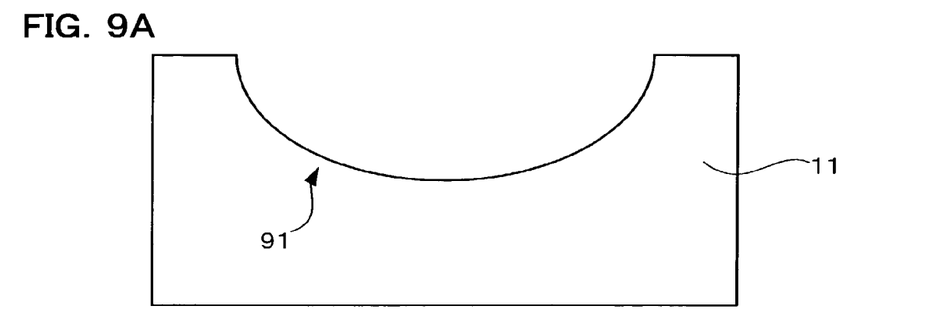
FIGS. 9A to 9D are schematic sectional views of a substrate used in variants of the embodiments.
Figure 9B:
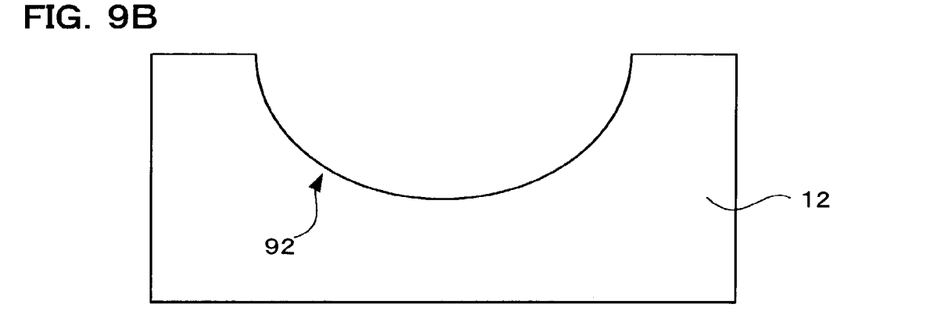
Figure 9C:
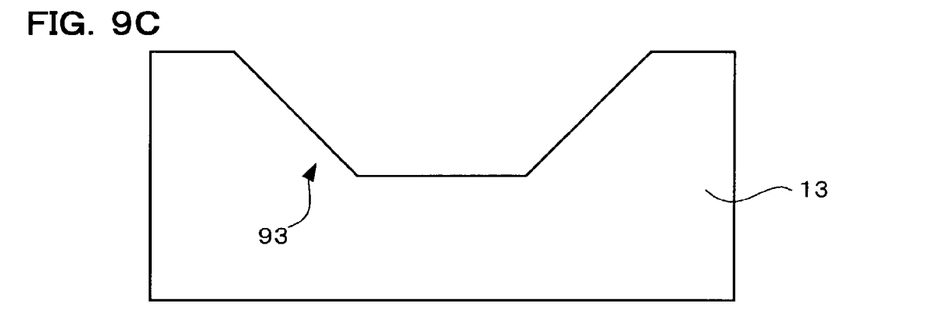
Figure 9D:
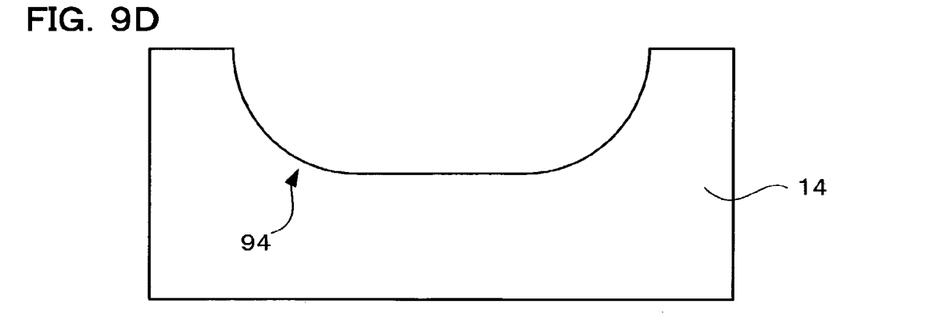

FIG. 8 is a cross-sectional view showing schematically an example of a surface emission type light-emitting device 800 being an eighth embodiment of the present invention. Elements having substantially the same function as elements shown in FIG. 1 are indicated with the same reference numerals, and principally the principal points of difference are described.

The light-emitting device 800 has the cathode 20 formed on the substrate 10 so that a part of its cross-section has a convex surface 22 of semi-elliptical shape with respect to the substrate. The light-emitting device 800 is constructed with the light-emitting layer 30 and anode 40 further laminated in sequence thereon. The cathode 20 is reflective toward the light generated in the light-emitting layer 30, and the anode 40 is transparent to light.

That is to say, since the light-emitting device 800 is formed in such a way that of the light generated in the light-emitting layer 30, the light emitted in the rear surface direction is reflected by the convex surface 22 of the cathode 20, so as to be emitted in the front surface direction, the light generated in the light-emitting layer 30 can be exploited efficiently. According to the light-emitting device 800, the emitted light is scattered according to the form of the convex surface 22, as a result of which a display device of high viewability can be realized.

The present invention has been described above in terms of preferred embodiments, but the present invention is not restricted to the above described modes of embodiment, and a variety of forms can be obtained within the limits of the essence of the invention. The following are some variant examples.

Variant Examples

In the first embodiment, second embodiment, and fourth embodiment, by virtue of the anode 40 the depression 90 is provided so that the light-emitting device is flat, but this is not a limitation. For example, a variety of layer configurations can be adopted, such as a topmost layer of uniform film thickness or the like.

In the first to fifth embodiments, the construction is adopted in which the cathode 20 is disposed below the light-emitting layer 30, and the anode 40 is disposed above the light-emitting layer 30, but this is not a limitation. For example, the cathode 20 may be disposed below the light-emitting layer 30, and the anode 40 disposed above the light-emitting layer 30. It should be noted that in this construction, the anode 40 can be formed so as to reflect light, and the cathode 20 can be formed to be transparent to light.

In the fourth embodiment and fifth embodiment, as the construction used to reflect light generated in the rear surface direction is used an electrode (20 or 40), but this is not a limitation. For example, as shown in the second embodiment and third embodiment, the substrate 10, dielectric multilayer film 60, or other reflecting member can also be used.

In the first to fifth embodiments, the description is of the light being emitted in the front surface direction, but this is not a limitation. For example, by using for the substrate 10 a glass substrate, plastic substrate, or the like which is transparent to light, the construction may equally be such that the light is emitted in the rear surface direction.

In the first to sixth embodiments, the cross-sectional form of the depression 90 of the substrate is described as V-shaped, but this is not a limitation. For example, as in the substrates 11 to 14 shown in FIGS. 9A to 9D, a variety of cross-sectional forms of the substrate can be adopted: a semi-elliptical shape (depression 91), semicircular (depression 92), a flat-bottomed trapezoidal shape (depression 93), a flat-bottomed basin shape with curved walls (depression 94), and soon. The convex surface 91 in the seventh embodiment and eighth embodiment is also not restricted to the semi-elliptical shape shown in the embodiments. For example, as with the above described concavities 90 to 94 a variety of embodiments of the cross-section such as a triangular convex surface or the like can be adopted.

What is claimed is:

1. A light-emitting device comprising:
    a light-emitting layer capable of generating light by electroluminescence;
    a pair of electrodes which applies an electric field to the light-emitting layer; and
    a substrate having a depression in a surface,
    wherein the light emitting layer is disposed within the depression of the substrate and has a convex surface extending away from the substrate, and is formed to function as an optical lens.

2. The light-emitting device as defined in claim 1, wherein at least part of one of the electrodes is disposed over the depression, and is capable of reflecting light generated in the light-emitting layer.

3. The light-emitting device as defined in claim 1, further comprising:
    a lens layer to function as an optical lens formed over the light-emitting layer.

4. The light-emitting device as defined in claim 1, wherein the substrate is capable of reflecting light generated in the light-emitting layer.

5. The light-emitting device as defined in claim 1, further comprising:
    a dielectric multilayer film which is capable of reflecting light generated in the light-emitting layer,
    wherein the dielectric multilayer film is disposed over the depression of the substrate.

6. An electronic instrument comprising the light-emitting device as defined in claim 1.

7. A light-emitting device comprising:
    a light-emitting layer capable of generating light by electroluminescence;
    a pair of electrodes which applies an electric field to the light-emitting layer;
    a gate electrode disposed between the electrodes which forms a conducting region within the light-emitting layer; and
    a substrate having a depression in a surface,
    wherein the light emitting layer is disposed within the depression of the substrate, and has a convex surface extending away from the substrate, and is formed to function as an optical lens.

* * * * *